(12) United States Patent
Dutta

(10) Patent No.: US 7,453,143 B2
(45) Date of Patent: Nov. 18, 2008

(54) HIGH SPEED ELECTRONICS INTERCONNECT AND METHOD OF MANUFACTURE

(75) Inventor: Achyut Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 10/793,363

(22) Filed: Mar. 4, 2004

(65) Prior Publication Data

US 2004/0173880 A1    Sep. 9, 2004

Related U.S. Application Data

(60) Provisional application No. 60/451,950, filed on Mar. 5, 2003.

(51) Int. Cl.
*H01Q 3/46* (2006.01)
(52) U.S. Cl. ............................... 257/700; 343/768
(58) Field of Classification Search ................ 257/664, 257/698, 700; 343/768, 779, 785
See application file for complete search history.

(56) References Cited

U.S. PATENT DOCUMENTS

| | | | | |
|---|---|---|---|---|
| 5,066,928 A | * | 11/1991 | Ikezi et al. ................. 333/20 |
| 5,166,693 A | * | 11/1992 | Nishikawa et al. .......... 342/422 |
| 2002/0167456 A1 | * | 11/2002 | McKinzie, III ............. 343/909 |
| 2002/0183013 A1 | * | 12/2002 | Auckland et al. ............ 455/73 |
| 2003/0043071 A1 | * | 3/2003 | Lilly et al. .................. 342/368 |
| 2003/0197658 A1 | * | 10/2003 | Lilly et al. .................. 343/909 |

* cited by examiner

*Primary Examiner*—Thomas L Dickey

(57) ABSTRACT

A high-speed electrical interconnection system is provided. The interconnection system comprises one or more electrical signal lines, or differential pairs of signal lines, and an in homogeneous dielectric system. The dielectric system further comprises a homogeneous dielectric layer interposed between the electrical signal lines, and an electrical conducting plane including a periodic array etched in the conducting material of the conducting plane. The inhomogeneous dielectric system exhibits a lower effective dielectric constant as compared to the dielectric constant of the homogeneous dielectric layer, resulting in lower microwave loss, reduced signal propagation delay, reduced signal skew and increased signal bandwidth. The interconnection system may be implemented for connecting one or more high speed electronic elements on-chip, off-chip, chip-chip connection on multilayer printed circuit boards, high speed die-package, high speed connectors and high speed electric cables.

15 Claims, 14 Drawing Sheets

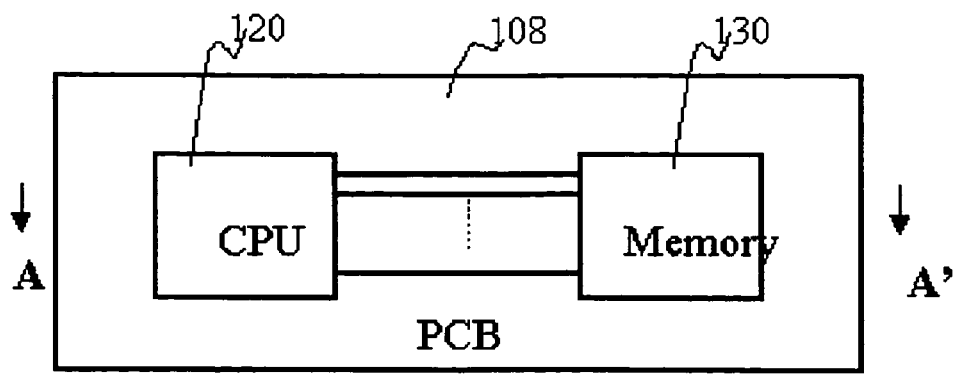
FIG. 2A
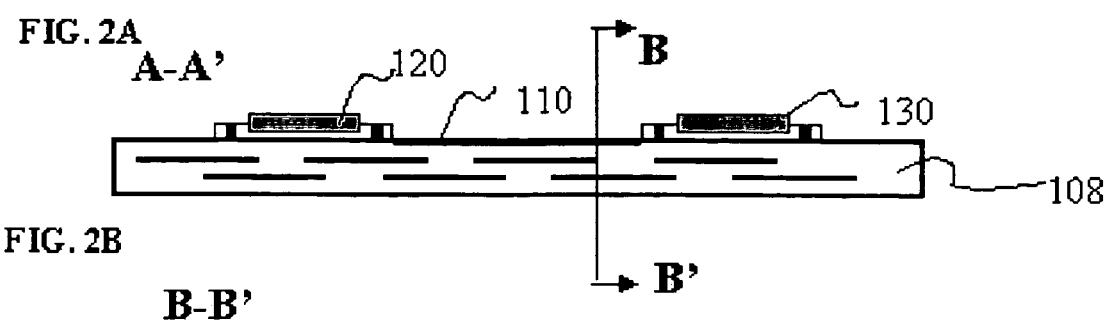
FIG. 2B
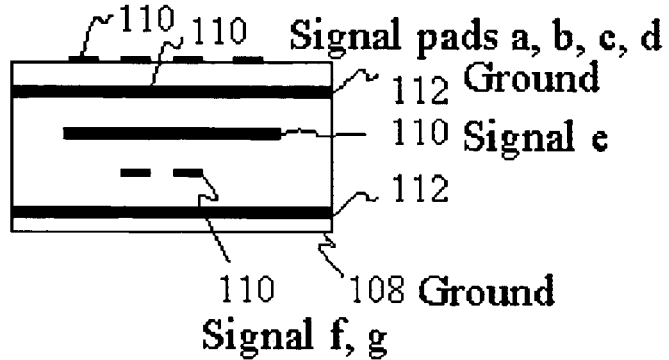
FIG. 2C
FIG. 2

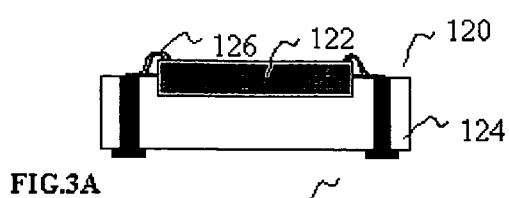
FIG.3A
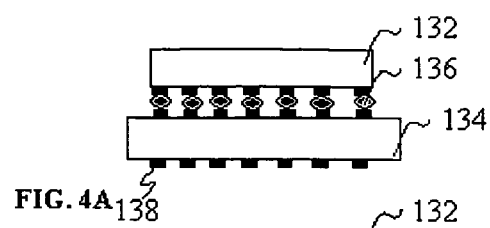
FIG.4A
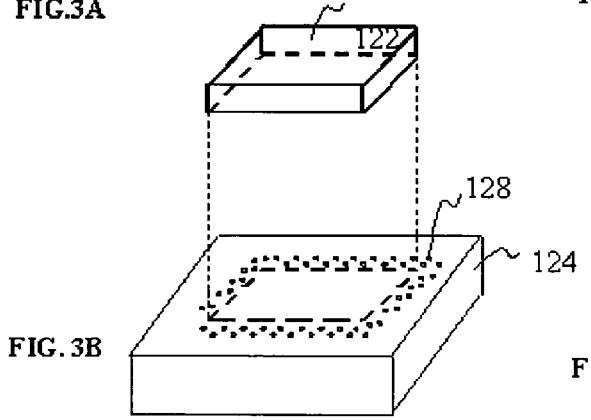
FIG.3B
FIG.3
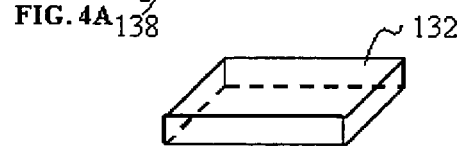
FIG.4B
FIG.4

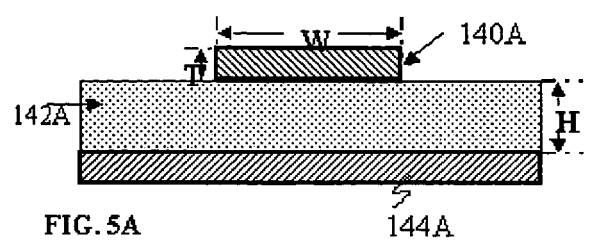
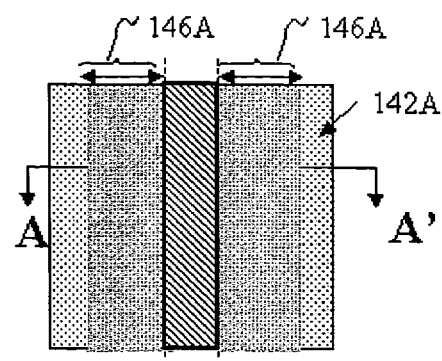
FIG. 5A
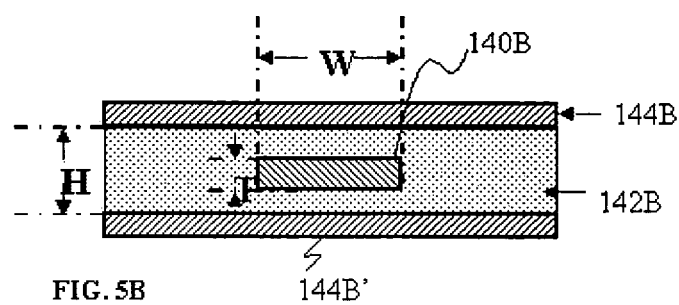
FIG. 5B
FIG. 5
FIG. 6A
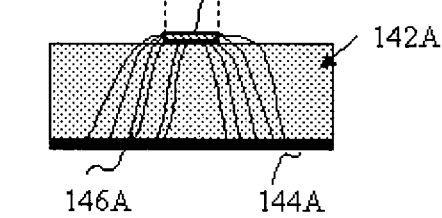
FIG. 6B
FIG. 6

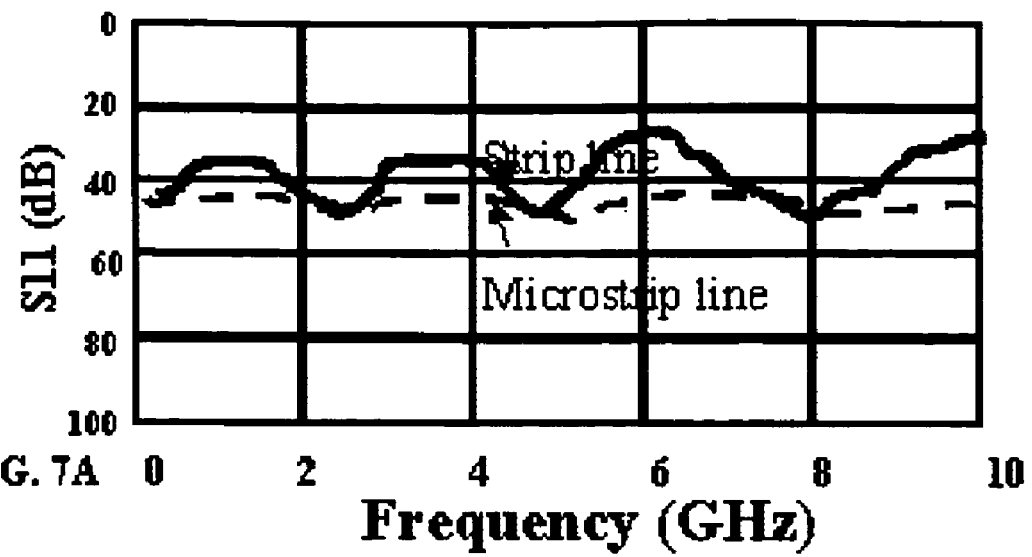
FIG. 7A
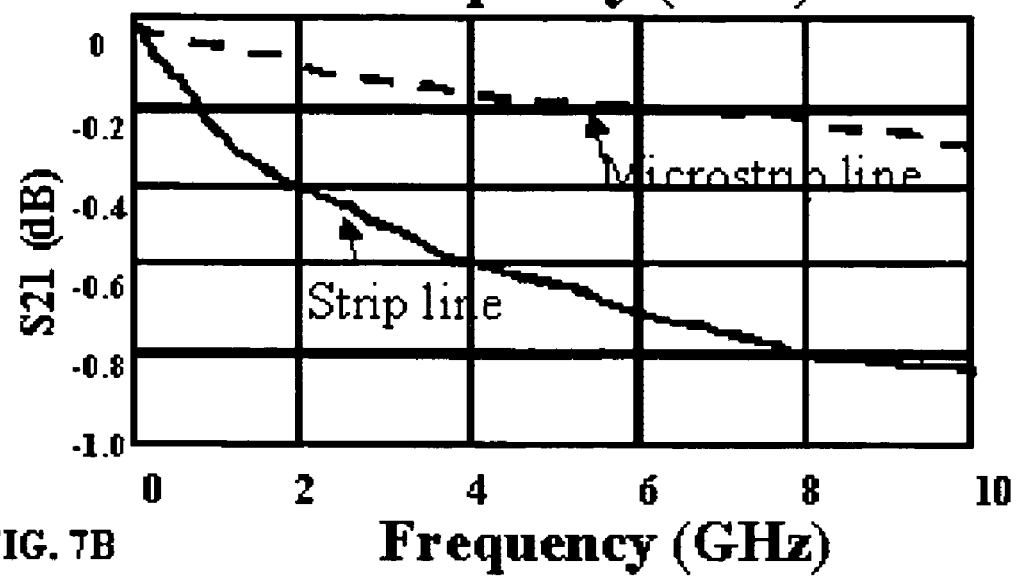
FIG. 7B
FIG. 7

US 7,453,143 B2

HIGH SPEED ELECTRONICS INTERCONNECT AND METHOD OF MANUFACTURE

CROSS REFERENCE TO RELATED APPLICATIONS

This application claims the benefit of U.S. Provisional Application No. 60/451,950 filed Mar. 5, 2003.

FIELD OF THE INVENTION

This invention relates to electrical interconnects to connect two or more electronics elements in on-chip (intra-chip) and off-chip (inter chip) level interconnection, high-speed connector, cable fabrication, and also chip packaging. More particularly, this invention is related to, (a) connecting two or more electronic devices inside the chip (for intrachip connection), (b) connecting the high speed signal line of single or multi processor chips to signal line of single or multi memory chips, which are used in all kinds of computers covering from personnel computer to super-computer, and also in game system, (c) also interface means (as the connector or cable) to connect two or multiple high speed electronics elements, and also (d) for high-speed chip packaging to connect to the chip (die) to package. This invention is also related to the high-speed electrical interconnection, optical interconnection or both electrical and optical interconnection where two or more high-speed electronics and/or optical elements are required to be connected.

BACKGROUND OF THE INVENTION

The increasing of higher level of integration within electrical integrated circuit (IC) leads to both higher data rates and larger number of IC interconnections. Today, the inherent signal speed of IC is increased to 3 GHz, and shortly it will be reached to 10 GHz and beyond. The number of pin connection is also increased, with single IC requiring close to 2000 interconnection (i.e. single processor), and shortly it will be increased to over 5000. Simultaneously achieving higher data rates and higher interconnect densities for both on-chip and also off-chip, will be increasingly difficult as the IC technologies continue to evolve increasing signal speed of electronic devices and interconnection number. In on-chip cases (intra chip), as the number of the electronic devices such as transistor are increasing with development of the fabrication technology, the interconnecting the electronic devices without sacrificing the signal speed is getting challenging. In off-chip case, high density interconnects, covering from die-level packaging to chip-to-chip (hereafter chip indicates the die with package) interconnection on the printed circuit board (PCB), will also be getting increasingly difficult as the IC technologies continue to evolve increasing the signal speed and interconnection number.

With increasing of the signal speed and interconnection number within and outside of the IC, low-cost high-level interconnect technique compatible to today's manufacturing process are highly desirable to make available in consumer level.

Generally, it is known that if the electronic devices (for both on-chip and off-chip) are connected with the help of the metal conductor, electrical signal can be flown and the electronic device can be communicate with each other. This is true for the low speed signal, below few MHz. In high-speed interconnection for both on-chip and off-chip interconnects, all connected signals should be considered to be propagated through well impedance matched transmission line. Any discontinuities in the electrical signal line due to impedance impedance mismatch, or the VIAs etc. cause the reflection, which degrades the signal waveform reaching to the other side of the electronics devices. At multi GHz frequencies, interconnect lengths become a significant fraction of the wavelength of the high frequency harmonics, and therefore interconnects must be design with proper concern of impedance, cross talk, and attenuation. Impedance mismatch must be minimized to reduce the reflections and prevent ringing, which can cause false decision (switching) in the receiver signal. Significant attenuation and rise-time degradation can be caused by losses in the transmission line. The transmission line loss is the sum of the conductor loss and dielectric loss, both of which are dependent on the frequency.

Today technology development pushes to reduce the size of the electronic device, resulting in utilization of number of the devices inside single chip. As the level of integration targeting for future 'system-on-a-chip' design, is increasing, the chip area is also increasing. Novel interconnection technique compatible to standard IC fabrication technology is necessary; yet preserve the signal speed while assuring the adequate isolation for high-speed data communication. With increasing of intrachip signal speed, the interchip (off-chip) signal speed also increases, which require also novel technique, which could be also compatible to today's PCB technology.

FIG. 1 and FIG. 2 are the schematic showing part of conventional on-chip (intra) and off-chip (inter-chip) interconnections. In on-chip interconnection as shown in FIG. 1, single substrate 100 comprises with many electronics devices 102, and are connected by the metal conductor 104. Dielectric layer 106 such as silicon oxide for Si device isolates each device. Metal conductor such as Al, Cu, W, and WSi etc. is used for connecting on-chip devices.

In off-chip interconnection, as shown in FIG. 2, the chip 120 (for example processor) is connected with chip 130 (for example 3) by multilayered electrical signal lines 110 in the PCB 105. FIGS. 3 and 4 show the schematic representing the conventional BGA (ball grid array) and CSP (chip-scaled package) based packaging for high-speed single chip package (for example processor). In both type of packaging, die 122 and die 132 are attached with the ceramic or polymer substrate 124 and 134, respectively, containing the matrix of pins 126 and 136. Outside pins 128 and 138, located at the bottomside of chip package (in both packaging cases) connect with the PCB, whereas topside of the package is connected with the heat sink to dissipate heat from the die. Both types of packages provide closer proximity of signal as on-chip. The fidelity of signal occurred due to the conventional interchip electrical signal connections 110 and ground/power 112 through multiplayer PCB 108. It is highly desirable having the board-level electrical interconnects for high-speed interchip connection, which could be compatible with existing IC package such as BGA, CSP etc., and also could be employed conventional PCB technologies.

Today's interconnection technology for both on-chip (intra-chip) and off-chip (inter-chip) are mainly based on the microstrip line or strip-line transmission layout on the dielectric material. FIG. 5A shows a cross-sectional of a microstrip layout, which refers to a trace routed as the top or bottom layer for example of a PCB for the case of off-chip interconnection. The electrical conductor 140A with width W and thickness T are laid on the dielectric material 142A having height H. The ground or power line 144A is located opposite of the signal conductor 140A. FIG. 5B is the cross-sectional view of strip line layout, which uses a trace 140B routed on the inside layer 142B for example of a PCB and has two voltage-reference planes (i.e. power and/or ground) 144B and 144B'. The impedances of microstrip line and strip line are expressed by:

$$Z_{microstrip}=[(87/\text{Sqrt}.(\epsilon_r+1.41)]\ln[(5.98\times H)/(0.8W+T)]\Omega \quad (1)$$

$$Z_{strip}=[(60/\text{Sqrt}.(\epsilon_r))]]]\ln[(4H)/(0.67\pi(0.8W+T))]]]\Omega \quad (2)$$

Equations (1) and (2) indicate that the impedance is directly proportional to the dielectric constant $\epsilon_r$, trace height H, and the inversely proportional to the trace width W and trace thickness T. In stripline layout, the signal line is sandwiched by the dielectric layer, whereas a microstrip layout has one conductor open to air. In microstripline type traces, the field is in both dielectric layer and air whereas in strip line type traces, the filed is confined inside dielectric materials. This causes a higher, effective dielectric constant stripline layout compared to microstrip layouts. Besides, these also causes the less dielectric loss in microstripline as compared with stripline. Higher effective dielectric loss experiences much dispersion or signal loss as compared with that of the microstrip line layout. FIG. 6 shows the top view and cross-sectional view of the microstrip line transmission layout, showing the electrical field distribution. The electrical field 146A is spreading both side of the electrical signal line 140A. FIGS. 7A and 7B are the frequency response of the microstrip line and strip line layout. As the effective dielectric constant (using of the same material) of the strip line layout is higher than that of the microstrip line layout. The signal is attenuated more in strip line layout in compared with increasing of the frequency. This also suggests that effective dielectric loss should be kept low to increase the bandwidth of the interconnection.

High-speed signal while propagating through the transmission line experiences the signal propagation delay, and it is dependent on the dielectric constant of the material. The signal propagation delay for the strip line and microstrip lines are expressed by:

$$t_{PD\ microstrip}=85[\text{Sqrt}.(0.475\epsilon_r+0.67)] \quad (3)$$

$$t_{PD\ strip}=85[\text{Sqrt}.(\epsilon_r)] \quad (4)$$

Equations (3) and (4) indicate that as $\epsilon_r$ increases, the propagation delay also increases. Microstrip line has comparatively lower propagation delay than the strip line layout for the fixed dielectric constant $\epsilon_r$.

As mentioned earlier, electrical field inside dielectric material having higher dielectric constant experiences more signal delay as compared with that of transmission line comprising with lower dielectric constant material. These causes signal skews for the different length signal lines. In this case also, lower dielectric constant material is necessary in the interconnection for high-speed signal interconnection. This is true for both on-chip and off-chip interconnection. Lower dielectric constant material with low dielectric loss offers following functions:

(1) Higher density interconnection is possible due to reduction of the cross-talk;
(2) reducing the capacitance of the interconnection, helping to transfer the signal longer distance;
(3) lower propagation delay, and
(4) reducing the microwave loss as the field is spread closer to the electrical conductor, and help to transmit the longer distance. In other words, help to transmit the higher speed signal as compared with the higher dielectric constant and with same loss tangent.

Besides the dielectric constant of the material or the type of the signal line, the microwave loss due to dielectric material and also the electrode structure also limits the bandwidth of the interconnection. Microwave-loss occurs due to the electrode structure mainly from skin-depth of the signal. As Cu's skin-depth at 100 GHz is 0.2 µm, the skin-depth due to the conductor structure is neglected. So, the bandwidth of the interconnection (for both on-chip and off-chip interconnection) is mainly dependent on the following factors:

(1) length of the interconnects;
(2) microwave-loss, mainly originated from the (a) dielectric constant, (b) dielectric loss tangent, and (c) electrode structure. As the length of the interconnections in on-chip and off-ship varies from the few micrometers to 10 to 30 cm, the length dependency can be neglected. Mainly, the interconnection bandwidth is dependent on the dielectric constant and the material loss tangent.

It is very straight forward that increasing the bandwidth can be possible using of the material having the lower loss tangent (dielectric loss). However, in this case, for both on-chip and off-chip interconnection new material development is necessary. Besides, manufacturing technology is needed to develop to implement in the product level.

Many work can be found in both on-chip and off-chip interconnection technology focusing on the material development. As for example, in on-chip interconnection, low-K (dielectric constant) material is under development stage, to achieve lower dielectric constant than non-doped silicon oxide. Lowering the dielectric constant than silicon oxide is possible in some extend from material characteristic point view, which is not long-term technique, and beyond that different materials are necessary. Besides, implementing new material in chip fabrication process will cost tremendously to make it mature. Having low-K material for on-chip interconnection is not only time consuming development, but also the costly short-term solution. On the other hands, in off-chip interconnection, especially for the chip-to-chip interconnection, more focused are being paid on shortening the length or on the interconnection layout. In both cases, implementing technology would need to pay high cost.

As explained above, the conventional electronics interconnect technology being used in on-chip and off-chip interconnection cannot be used as the need of the signal speed is increasing. And also exiting conventional electrical interconnects have the limitation of achieving the bandwidth in certain level, beyond that complete manufacturing technology is needed to be changed which is costly for IC and PCB industries. It is highly desirable to have lower dielectric constant and lower dielectric loss (loss tangent) by adopt a technique or method which can be easily implemented, and which can use the standard dielectric material and IC and PCB technology.

SUMMARY OF THE INVENTION

Accordingly, it is an object of the invention to provide the technique to reduce the effective dielectric constant and effective dielectric loss of interconnection system material to increase the bandwidth of the interconnection.

It is also an object of this invention to provide the fundamental techniques which could be used to increase the interconnects speed usable in both on-chip and off-chip interconnects, high-speed connector, high speed cables, and also high speed chip packaging.

It is also an object to provide the technique to localize the electrical field to prevent the electrical field distributing away from the electrical conductor.

According to the invention it is an object of this invention to provide the interconnection structure to reduce the microwave-loss by adopting the interconnection structure.

Another object of the present invention is to provide the interconnection structure for intra-chip (on-chip) interconnection, which is compatible with available IC fabrication technology.

Another object of the present invention is to provide the interconnection structure for inter-chip (off-chip) interconnection on the board, which is compatible to available PCB technology.

Another object of this invention is to provide the structure for making the high bandwidth connector and cable. This helps to increase the bandwidth of the cable/connector tremendously using the existing material system.

Another object of this invention is to provide the fabrication technology of the technique implementable in on-chip interconnection using the standard fabrication process.

Another object of this invention is to provide the fabrication technology of the off-chip interconnection on the PCB board using the PCB technology.

According to the invention, the interconnects system comprises,
(i) single or multiple electrical conductors for carrying the electrical signal from one electronics element to another and vice-versa for electrical communication;
(ii) a dielectric system comprising with uniform single or multiple dielectric layers, and;
(iii) a ground or power line opposite side of the dielectric system comprising with the metal arrays with certain pitch and are located in other side of the dielectric system;
wherein the metal array could be one-dimensional and the shape of the array structure could be the square or hexagonal, circular, or the shape convenient in the manufacturing.

According to the invention, the interconnects system comprises,
(i) single or multiple electrical conductors for carrying the electrical signal from one electronics element to another and vice-versa for electrical communication;
(ii) a dielectric system comprising with uniform single or multiple dielectric layers, wherein the said metal arrays are located inside the dielectric system;
(iii) a ground or power line located other side of the dielectric system, and;
wherein the metal array could be one-dimensional and the shape of the array structure could be the square or hexagonal, circular, or the shape convenient in the manufacturing.

According to the invention, the interconnects system comprises,
(i) single or multiple electrical conductors for carrying the electrical signal from one electronics element to another and vice-versa for electrical communication;
(ii) a dielectric system comprising with uniform single or multiple dielectric layers, wherein the single or multiple metal arrays are located inside the dielectric system in different height, and;
(iii) a ground or power line located other side of the dielectric system,
wherein the metal array could be one-dimensional and the shape of the array structure could be the square or hexagonal, circular, or the shape convenient in the manufacturing.

According to the invention, the interconnects system comprises,
(i) single or multiple electrical conductors for carrying the electrical signal from one electronics element to another and vice-versa for electrical communication, and;
(ii) a dielectric system comprising with uniform single or multiple dielectric layers, wherein the single or multiple metal arrays are located inside the dielectric system in different height;
wherein the metal array could be one-dimensional and the shape of the array structure could be the square or hexagonal, circular, or the shape convenient in the manufacturing.

According to this invention, dielectric system consisting of the dielectric material and single and multiple metal arrays located inside the dielectric material will have the effective dielectric constant and effective dielectric loss lower than the dielectric loss and dielectric constant of the dielectric material and helps to increase the bandwidth of the interconnect line. According to this invention, any or all-metal arrays could be ground or power line in the interconnects system.

According to the invention, the dielectric system alternatively is based on the photonics crystal or electronics crystal system or their quasi photonic (or electronic) crystal system, consisting of the periodic arrays of the dielectric structure formed by putting metal arrays with pitch and lattice constant into the dielectric slab, wherein the electromagnetic wave is propagated inhomogeneously.

According to this invention, the dielectric system is designed alternatively based on the photonic band-gap or electronic bad-gap principle or their quasi principle.

According to this invention, the electrical signal line could be microstrip type or strip line type or coplanar type waveguide, and also the signal line could be single ended or differential pairs in the interconnects systems.

According to this invention, the effective dielectric constant and effective loss tangent of the dielectric system is reduced, which reduce the microwave-loss and makes to increase the interconnects bandwidth and also reduce the signal propagation constant. The lower the microwave loss, the closer to be the electromagnetic wave to the speed of the light.

The invention offers to connect the signal line of one electronics elements to other electronic elements to communicate without sacrificing each electronic element's signal speed. These inventions could be easily implementable as today's manufacturing technology can be used. The methods described in this disclosure enables to make the electronics interconnects for intra-chip, inter-chip connection in cost-effective manner and suitable for practical application. These inventions also used to high speed (bandwidth) electronic connector, and cable where two or more electronic elements are to be connected. Furthermore, this invention has also in wide application in the high-speed chip packaging.

Another advantage of this invention is that conventional IC fabrication technology for on-chip interconnection, and conventional PCB technology for off-chip interconnection, and also conventional manufacturing technologies available for connector and cable manufacturing.

The other object of this invention is to minimize the skew in the signal interconnection, occurred due to the signal propagation delay, by reducing the microwave loss.

Other objects, features, and advantages of the present invention will be apparent from the accompanying drawings and from the detailed description that follows below.

BRIEF DESCRIPTION OF THE DRAWING

The invention will be explained in more detail in conjunction with the appended drawings wherein.

FIGS. 2A, 2B, and 2C are the top, front and side cross-sectional views' showing prior art of electrical interconnects for inter-chip (off-chip) connection;

FIGS. 3A and 3B are top and cross-sectional views showings BGA based chip package for high-speed die package. This is an explanatory diagram showing chip package as mentioned in FIGS. 2A, 2B, and 2C;

FIGS. 4A and 4B are top and cross-sectional views showings CSP based chip package for high-speed die package. This is an explanatory diagram showing chip package as mentioned in FIGS. 2A, 2B and 2C;

FIGS. 5A and 5B are the simplified cross-sectional views of the microstrip and stripline transmission line. This is an explanatory diagram showing the prior-art based on which today's electronic interconnection is made;

FIGS. 6A and 6B are the top and cross-sectional views, showing the electrical field distribution for the microstrip line transmission line. This is an explanatory diagram showing the prior-art based on which today's electronic interconnection;

FIGS. 7A and 7B are the frequency responses (S11 and S21) of the microstrip and strip transmission lines. This is an explanatory diagram showing the prior-art of today's interconnection;

FIG. 13B is taken along AA' direction of FIG. 13A;

DETAILED DESCRIPTION

Figure 1:
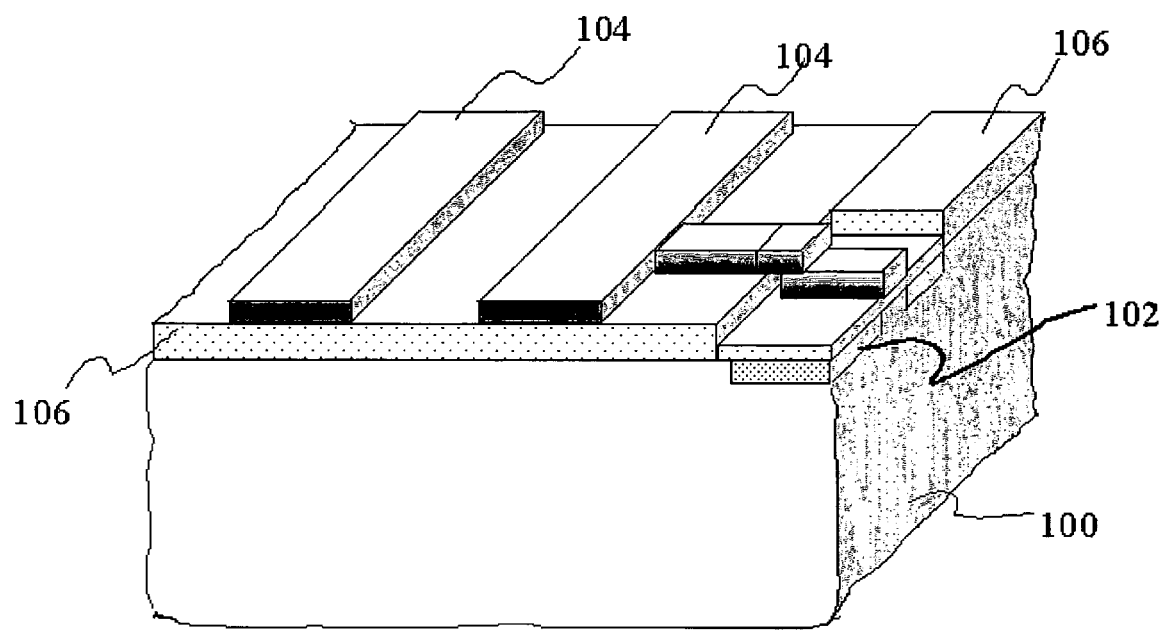
FIG. 1 is the cross-sectional view showing the prior art intra-chip (on-chip) electrical interconnection. For simplicity, MOS-transistors and their electrical interconnections is shown.

The best modes for carrying out the present invention will be described in turn with reference to the accompanying drawings. In the following description, the same reference numerals denote components having substantially the same functions and arrangements, and duplicate explanation will be made only where necessary.

An important point of high speed electronic interconnects system according to the first embodiment is that the microwave loss is to be reduced by reducing the effective dielectric constant, resulting in increasing the bandwidth of the interconnects and keeping the signal-speed of the interconnection system closer to the source speed. Other point is also kept into mind that the technique is to be cost effective, and compatible to standard manufacturing technology can be used.

In interconnects system for two or more electronics elements (on-chip electronic devices such as transistors, or two or more ICs etc.) connections, the signal can be conveyed electrically through the wire (electrical conductor) laid on the dielectric medium. For high speed signal transmission electrical conductor is to be transmission line of type microstrip or strip line. The signal speed in the interconnects (i.e. bandwidth of the interconnects system) is mainly dominated by; (a) signal conductor parameters (i) length and (ii) thickness, and (b) dielectric material properties (i) dielectric constant, and (ii) loss tangent. Longer interconnect length will increase the capacitance by $A\epsilon L/d$, where A is the area of the signal conductor, $\epsilon$ the dielectric constant of the material, and d the thickness of dielectric material. With optimized design, capacitance is mostly limited by the dielectric constant. As frequency increases the signal is started to attenuate due to the skin effect. For example Cu at 100 GHz, the skin-depth For comparatively lower frequency, this skin-depth can be neglected. Therefore, bandwidth of the interconnect system is mainly dominated by the dielectric material properties such as dielectric constant and loss tangent. For increasing the bandwidth of the interconnects, their values should be low.

It is very straight forward that increasing interconnects bandwidth can be possible by using of the low dielectric loss and low dielectric constant material in both on-chip and off-chip interconnects. However, in both applications, new materials are needed to develop and manufacturing technologies are to be developed to implement new material into practical interconnects. Other ways, we could increase the bandwidth of the interconnects if somehow we could reduce the effective dielectric loss and reduce the effective dielectric constant of the dielectric system used in the interconnects. It is highly desirable to invent the interconnect structure which have low effective dielectric constant, and which could use conventional manufacturing technology.

In the preferred embodiments explanation, first the techniques to reduce the effective dielectric constant and effective dielectric loss will be explained considering the single signal, and later part of this section cover some applications of the preferred embodiments.

FIG. 8A is the cross-sectional view and FIG. 8B is the top-view of the metal used at the bottom of the dielectric for interconnect system, in the first preferred embodiment in accordance to the present invention, wherein like parts are indicated by like reference numerals as used in FIGS. 6, so that repeated explanation is omitted here. The microstrip line configuration consisting of signal line 140B with thickness T3, width W3, and the uniform dielectric substrate 142B, and ground plan 200 as a part of the interconnect are shown. The ground plan 200 consists of an array of etched slots 202 of alternating widths, as shown in FIG. 8B, forming the in the metal periodic structure 204. Its pattern is a 2D square lattice (with span a3) periodic structure with a unit cell geometry exhibiting 180-degree symmetry. When the signal line for interconnects is in z-direction, the induced current flow freely through the structure and the signal is transmitted, while the signal is rejected when the line is in the x-direction. Because of the stepped-impedance slots breaking the continuity of the metal paths. The z-direction is in propagation and x-direction is the attenuation direction. The electrical filed can be localized in metal slab, and thereby reducing the effective dielectric constant which results in reducing the microwave loss and increasing the bandwidth of the interconnect system. Based on the selection of the span a3 and the square lattice size, the microstrip configuration as shown in FIG. 8A can have the uniplanar photonic band-gap effect, and can have the control of electrical field and can control the level bandwidth increase of the interconnect.

As for example, a simple structure of ground plan as shown in FIG. 8B is shown. The present invention also covers different ground plan having different size and shape of the lattice and unit cell. FIG. 9A is the cross-sectional view and FIG. 9B is the top-view of the metal used at the bottom of the dielectric for interconnect system, in the second preferred embodiment in accordance to the present invention, wherein like parts are indicated by like reference numerals as used in FIGS. 8A and 8B, so that repeated explanation is omitted here. Microstrip line configuration with signal line 140B, dielectric substrate 142B, ground plan 206. The ground plan consists of array of the slots 208 making the metallic periodic structure 210 having square lattice of a3'. This configuration also acts as the same as that of explained in FIGS. 8A and 8B, so that repeated explanation is omitted here.

Figure 8:
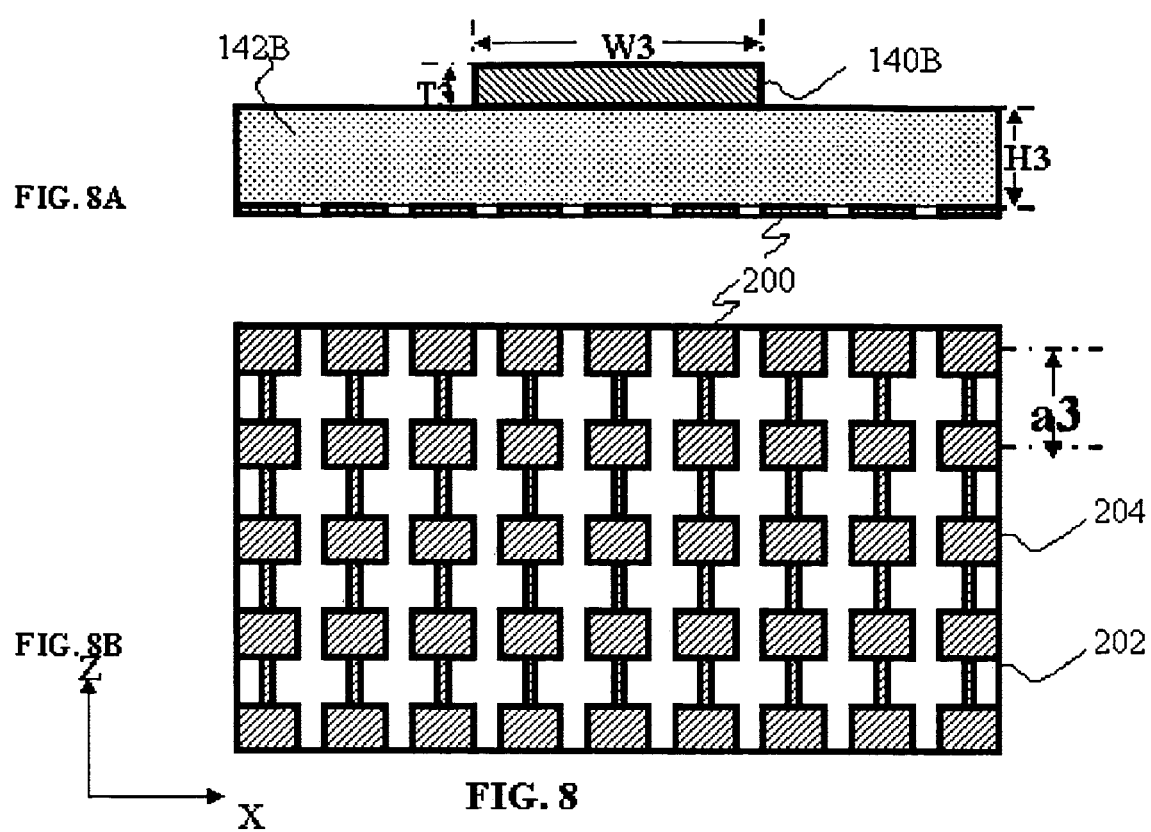
FIG. 8A is the cross-sectional view and FIG. 8B is the metal array layout, illustrating the microstrip configuration for electronic interconnects in a first preferred embodiment according to the invention.
Figure 9:
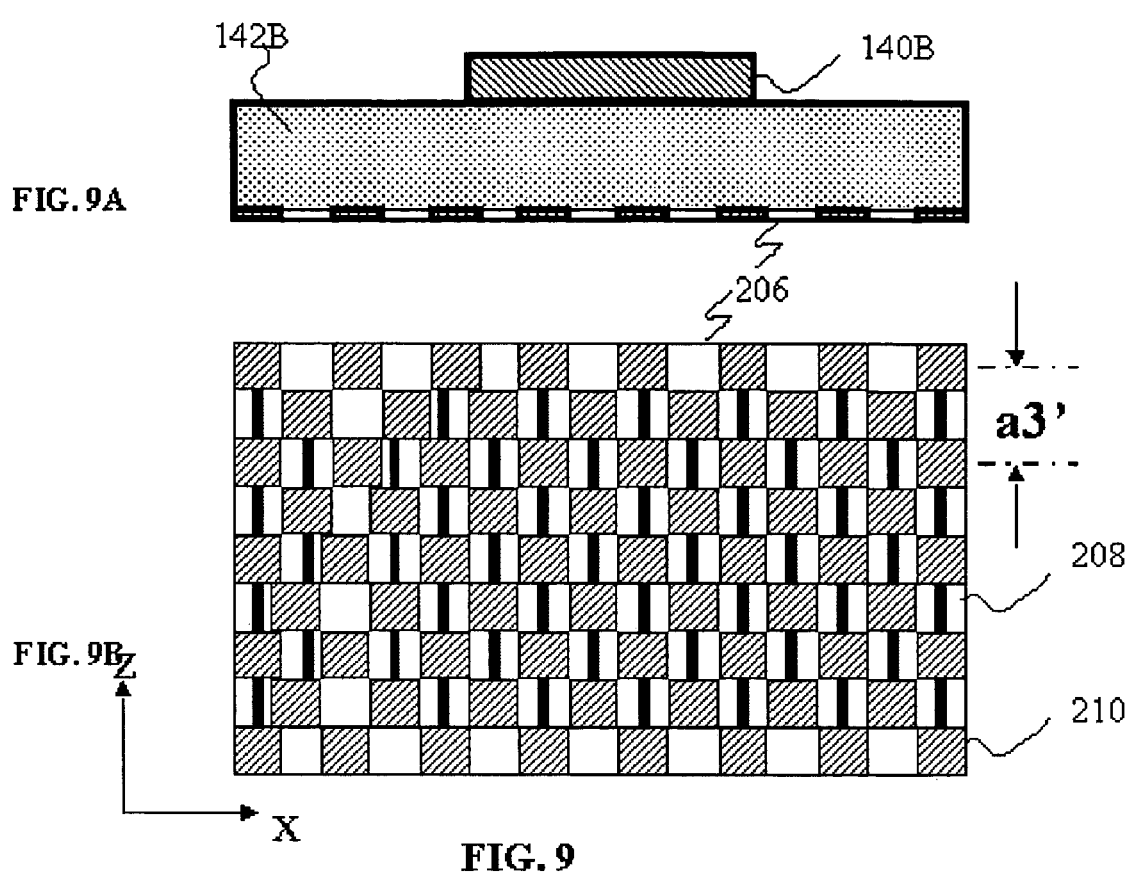
FIG. 9A is the cross-sectional view and FIG. 9B is the metal array layout, illustrating the microstrip configuration for electronic interconnects in a second preferred embodiment according to the invention.
Figure 10:
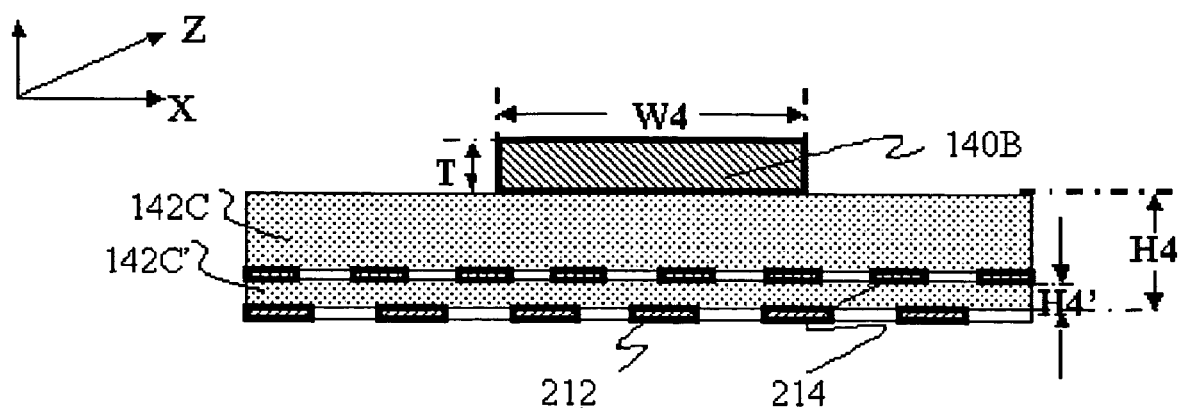
FIG. 10 is the cross-sectional view illustrating the microstrip configuration on the dielectric system for electronic interconnects in a third preferred embodiment according to the invention. The difference with FIGS. 8 and 9 is that the dielectric system has multiple metal arrays located inside the dielectric slab and separated by some distance.

FIG. 10 is the cross-sectional view of a portion of the interconnect system in the third preferred embodiment in accordance to the present invention, wherein like parts are indicated by like reference numerals as used in FIGS. 8 and 9, so that repeated explanation is omitted here. In the preferred embodiment, microstrip line configuration consisting of signal line 140B with width W4 and thickness T, two dielectric layers of 142C, and 142C' with the height of H4 and H4', respectively, multilayer metal plans 212 and 214. The metal plans used in the preferred embodiments are the same as that of those explained in FIGS. 8 and 9. Both 212 and 214 have the same pattern. The differences in two metal plans 212 and 214 are that inner metal plan has the period smaller than the outer metal pan 212. Based on the range of the signal frequency and the shape and size of the lattice, the periodicity of inner metal plan can be selected for example one ½, ¼ etc. of period of outer metal plan.

Using of the multilayer structure as shown in FIG. 10, broadband interconnect can be designed. Outer larger period metal plan can be connected to power or ground and control the lower frequency component of the signal (especially first part of the frequency response), and the inner periodic metal plan with smaller period controls the high frequency component of the signal, usually the second part of the frequency response. For simplicity, we have shown two layers, however this present invention also includes the system with more than two layers having the smaller period in the inner most metal plan can be used to make the broadband of the interconnection system.

FIGS. 11A, 11B, 11C, and 11D are the cross-sectional views of a portion of the interconnect systems in the fourth preferred embodiment in accordance to the present invention, wherein like parts are indicated by like reference numerals as used in FIGS. 8, 9, and 10, so that the repeated explanation is omitted here. In the preferred embodiment, microstrip lines configuration consisting of signal line 140B, single or plurality of dielectric layers 216, single or multiple dielectric systems of 218 consisting of the air hole cylinders or spares into the dielectric substrate, and/or the single or multiple metal plans of 220 with periodic metal structure (as explained in FIGS. 8, 9, and 10), and or uniform ground plan 222. This combination can make the broadband interconnects.

Figure 12:
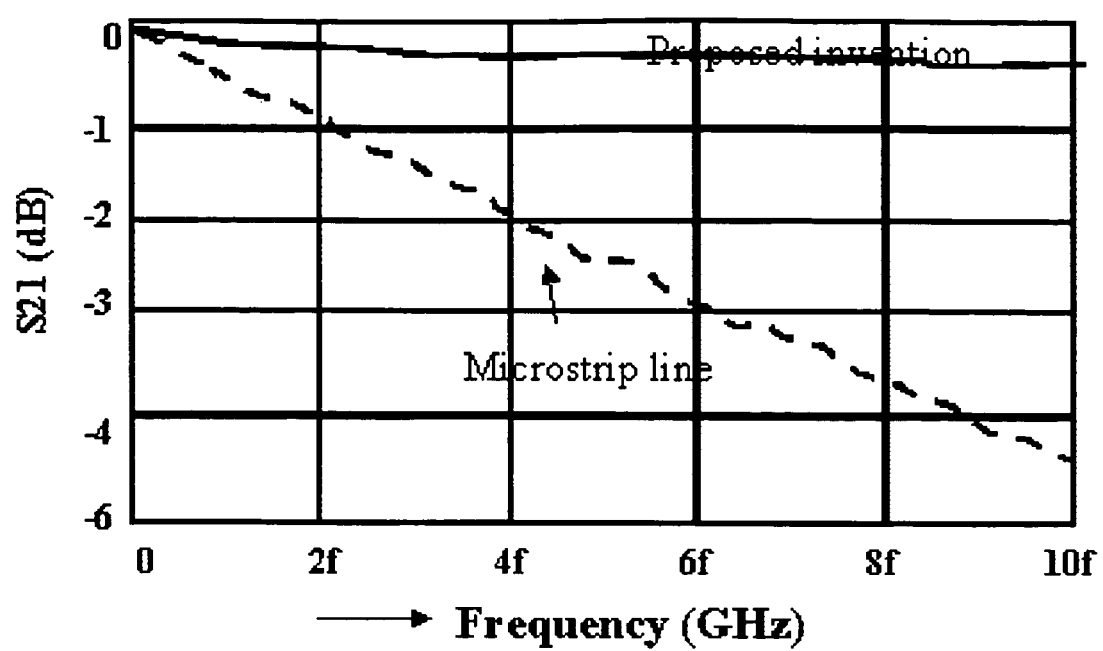
FIG. 12 is the frequency responses (S21) comparing the conventional microstrip transmission line on the uniform dielectric as shown in FIG. 6, and microstrip transmission line on the dielectric system as shown in FIGS. 8 in the fifth embodiment according to the invention.

FIG. 12 is comparing the frequency responses of microstrip configurations shown in FIG. 6 and FIG. 8, as the prior art and the preferred embodiment in the fifth embodiment according to the invention. Due to reduction of the microwave-loss, the frequency response can be improved tremendously as compared with the conventional mircrostrip line where the electrical field is uniformly distributed away from the signal line.

According to the invention, based on the interconnect structure design, the effective dielectric loss and effective dielectric constant of the interconnect system can be controlled. This helps to add many features in the interconnection such as varying the phase velocity (which is function of the dielectric constant), varying the bandwidth of the interconnect; help to adjust the skews of the signal etc. in the single interconnect system. According to the preferred embodiment, ideally, the speed of the signal in the signal line can be made to speed of the light in the air, if other loss due to the signal line structure such as the electrode parameter (resistance, capacitance) are neglected. The bandwidth of the electronic interconnect system can be possible to make the closer or greater than optical fiber (closer to the light). In the example, the dielectric system consisting of the backside-trench or backside slot is considered. This invention covers all high-speed interconnect systems applying in the on-chip and off-chip application. This also includes the means such as the connector and cable used to high-speed connection of electronic elements covering transistor to instruments.

Using single or plural of dielectric layers as shown in FIGS. 8 to 11 with metal plans, broadband interconnects can be designed. For simplicity, we have shown single layer transmission line, however this present invention also includes the system with more than single layer. According to the present invention, it is our object to control the attenuation and signal propagation delay of the electrical signal. In the preferred embodiments, as explained above from FIGS. 8, the microstrip line configuration with single electrode is shown for signal line in the object of explaining the inventions. These inventions also cover single or multiple signal lines in other configuration such as strip line or coplanar-line configurations. Signal lines in these cases could be single or differential pairs lines. In the preferred embodiment, the single layer configuration with single electrode is shown for signal line, the present invention also cover other multi-layer configurations with single and multi electrodes and also any configuration such as stripline, microstripline or coplanar or combination of their configuration in each layer.

In the preferred embodiments, the dielectric substrate is mentioned in an object to cover all dielectric materials, which show the dielectric properties. The dielectric materials include all kinds of ceramic materials such as Duroid, FR4, AlN, $Al_2O_3$, Mullite ($3Al_2O_3:2SiO_2$), SiC, $SiO_2$, Silicon nitride, silicon carbide, Silicon-Oxy-Nitride, BeO, Cordierite(magnesium alumina silicate), BN, Glass (with different compositions), epoxy glass, CaO, MnO, $ZrO_2$, PbO, alkalihalide (e.g. NaBr, NaCl) etc.) BN, BeO, and all kinds of low temperature cofired ceramics etc., and all kinds of the polyimides and benzocyclobutenes (BCBs) having dielectric properties. All kinds of polymer materials having dielectric properties falls also under this dielectric material. These dielectric materials can be made using high temperature ceramics processing or using the IC fabrication process. Polymer dielectric material also includes, but not limited to, Teflon, liquid crystal polymer, epoxy, parylene, silicone-polyimide, silicone-gel, fluorinated ethylene propylene copolymer. It also includes materials of elastomers (e.g. silicone elastomer), monomers, and gels. Dielectric materials, which can be made using high temperature ceramics processing or using the IC fabrication process, also include this category. All standard polymers can be available from the standard manufacturer for example, Du-pont, Hitachi-Chemical, Mitsui, and Mitsubishi-Chemical Industries. Gore-Tex, Japan markets liquid crystal polymer.

In the preferred embodiments as explained FIGS. 8 to 11, dielectric systems with single or multiple metal plans located inside the dielectric slabs are considered. Any or all of the metal plans could be could be ground line or power line. The metal plans could be the any conducting plans.

According to the present invention, the technique of reducing the microwave-loss by reducing the effective dielectric loss is explained in the preferred embodiments as shown in FIGS. 8 to 11. The preferred embodiments can be applied in much application in different ways and forms. For examples, preferred embodiments mainly can be used for high speed interconnects for connecting high-speed multiple (two or more) electronics elements. The application includes, but not limited to, (a) on-chip interconnects for example, for connecting the electronics devices and/or connection electrical and optical devices, (b) off-chip interconnects for example, connecting two or more electronics chips on the board, (c) high speed chip (die) packaging, (d) high speed electrical cable for connecting multiple electrical modules for example board-to-board interconnection, rack-to-rack interconnection, etc. and (e) high speed connector, used as interface means to connect high speed electronics elements.

In the preferred embodiments as explained below, different applications are explained in an object of showing the application (of the techniques to reduce the microwave loss and dielectric constant to increase the bandwidth and to reduce the signal propagation delay), but not limited to the specific description provided.

Figure 13A:
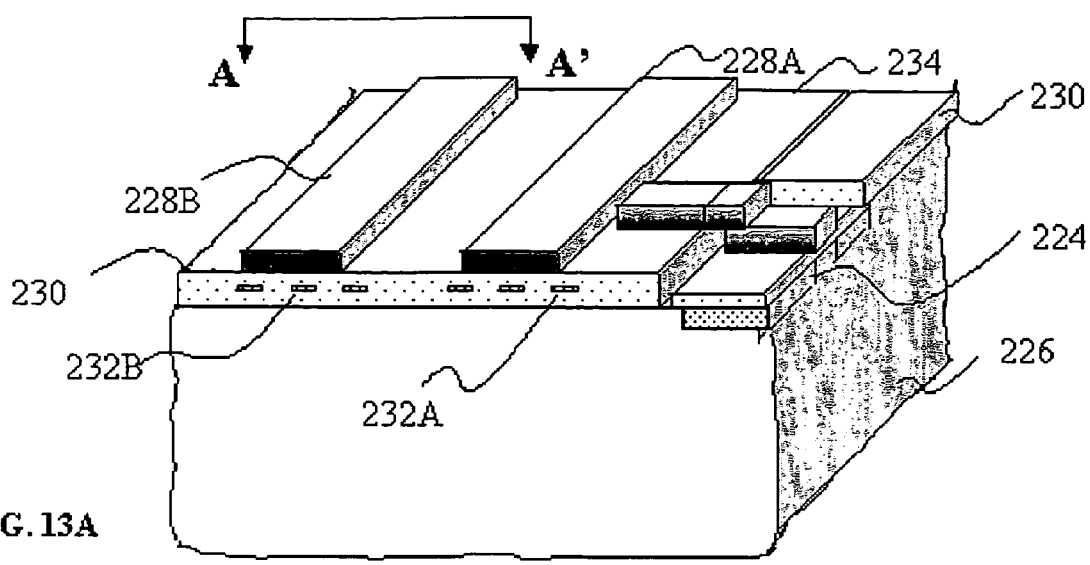
FIGS. 13A and 13B are the cross-sectional views, illustrating the on-chip (intra-chip) interconnections having the periodic dielectric layer formed by putting the metal array inside or outside the dielectric layer, in the sixth preferred embodiment according to the invention.
Figures 13, 13B:
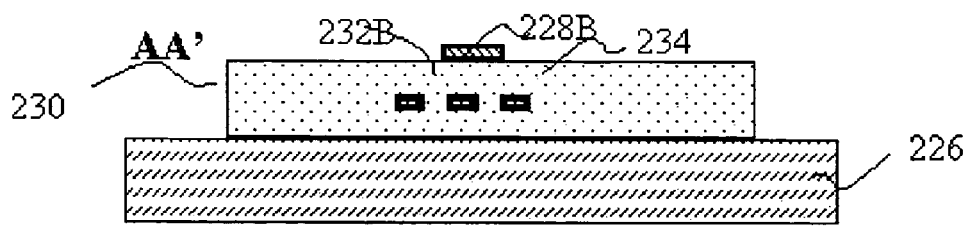

On-Chip Interconnection:

FIG. 13A is the cross-sectional view of a portion of on-chip interconnects system in the sixth preferred embodiment in accordance to the present invention, wherein like parts are indicated by like reference numerals, so that repeated explanation is omitted here. FIG. 13B is the cross-section view along AA' direction of FIG. 13A. In the preferred embodiment, electronic MOS (metal-oxide semiconductor)-device 224 on semiconductor substrate 226 (e.g. silicon), is connecting with other electronic device (not shown) by signal line 228A. Plurality of electronics devices on semiconductor substrate (for example Si (226)) can be interconnected by signal lines like 228A and 228B. The signal line 228A (and also 228B) is made on the periodic dielectric system 230 consisting of the air holes (spheres or cylinder) arrays 232 with diameter and span, into the dielectric layer 234. The portion of the dielectric 236A (and 236B) over which the signal line is to be laid, are kept uniform (and not consisting of the air hole arrays). Coverage (not shown) can be used on top of the interconnects using the same dielectric material used in the dielectric system. The dielectric layer 234 is deposited using standard IC fabrication technology such as chemical vapor deposition (CVD), or sputtering, or evaporation technique. After making patterns using standard photolithography technology, the metal plan 232 are formed inside the dielectric layer 234 using the dry-etching (or wet-etching) technology such as reactive ion beam etching (RIBE), reactive ion etching (RIE), or milling etc. Subsequent patterning and metallization using lift-off technique can make the signal lines, which connect the electronics devices on-chip.

According to preferred embodiment, on-chip interconnects using the dielectric system can have single or multiple techniques (for reducing the microwave loss), as explained in FIGS. 8 thru 11. Metal plans can be used in the dielectric system. Dielectric materials include all kinds vapor deposited dielectric material such as silicon oxide, silicon nitride, silicon oxynitride, silicon carbide etc. Microporous silicon can also be used as dielectric layer 234. Dielectric materials also include all kinds of the vapor deposited or spin-coated polymers such as benzocyclobutene, acrylate based polymer, elastomer or monomer etc. In the preferred embodiments as explained in FIGS. 13, microstrip line or single metal line configuration is considered, the signal line also includes strip line, or coplanar line configuration with single or multiple signal lines (as single or differential). Dielectric coverage (not shown) using of the same or different dielectric material can be used.

Off-Chip Interconnections:

In the preferred embodiment as explained below, it is an object to use the techniques as explained in FIGS. 8 to 11, in the off-chip interconnects for multiple chip interconnection on the board. The board here considered is the board made from FR4 material or any other kind of dielectric material as mentioned previously. Similar technique can be applicable for other dielectric material board as explained earlier.

Figure 14:
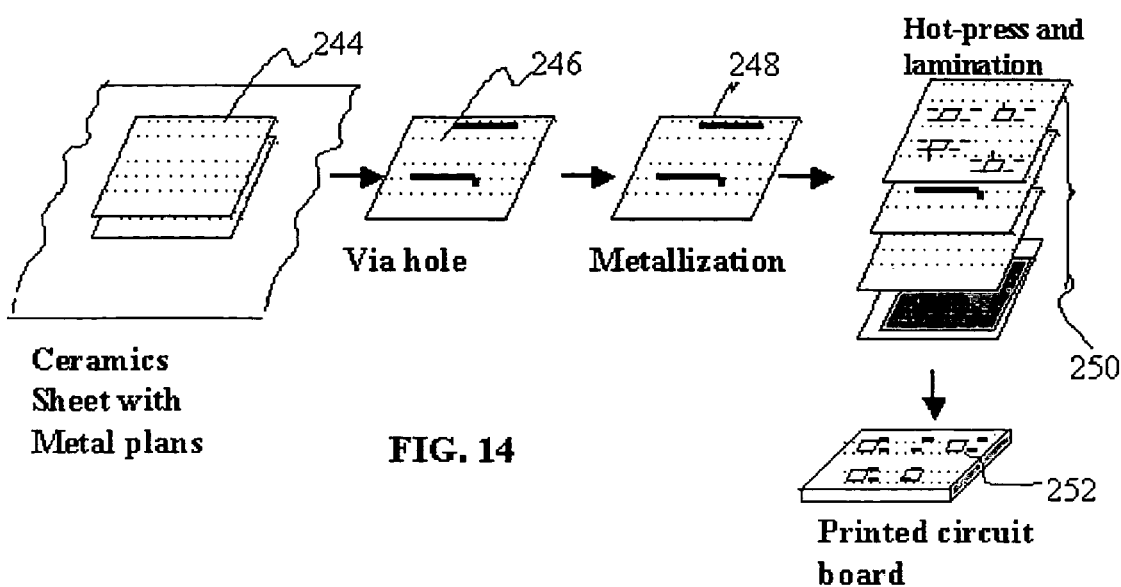
FIG. 14 is the schematics illustrating the fabrication process of the PCB based having the periodic dielectric structure in the seventh preferred embodiment in accordance to the present invention.

FIG. 14 shows the flow-chart of the printed circuit board fabrication process for the off-chip interconnects in the seventh embodiment in accordance to the invention, where in the like parts are indicated by the like numerals, so that repeated explanation is omitted here. The dielectric sheet with embedded metal plans (not shown) is made using the standard PCB technology for example using the slurry casting process. The slurry is cast into about 200 µm to 500 µm thick ceramic sheets by slip cast process. As the dielectric system has metal plans additional process may necessary to make the metal plans. Via holes are formed through the dielectric sheet with air holes 244 by a punching machine with punches and dies. Low resistivity conductor paste onto the punch sheet. In this process, via holes are filled with the paste to form the contacts between the signal lines. Low electrical resistivity material such as silver-palladium, and gold instead of molybdenum or tungsten refractory material can be used. The sheets are sintered at high temperature, which makes lower electrical resistivity. Metallization sheet 248 is made using the conventional PCB technology. The metallized sheets 248 are precisely stacked in a pressing die in sequence by the stacking machine. These sheets 250 are laminated together by hot press. Density heterogeneities in the laminated samples influence any shrinkage in the sintered substrate. Therefore, this lamination process is homogenously carried out by means of the correct dimensional die and punch with flat surfaces. Burn out and sintering process for the multilayered PCB board 252, may necessary after lamination at the temperature suitable to ceramic material used as the sheet.

Figure 15:
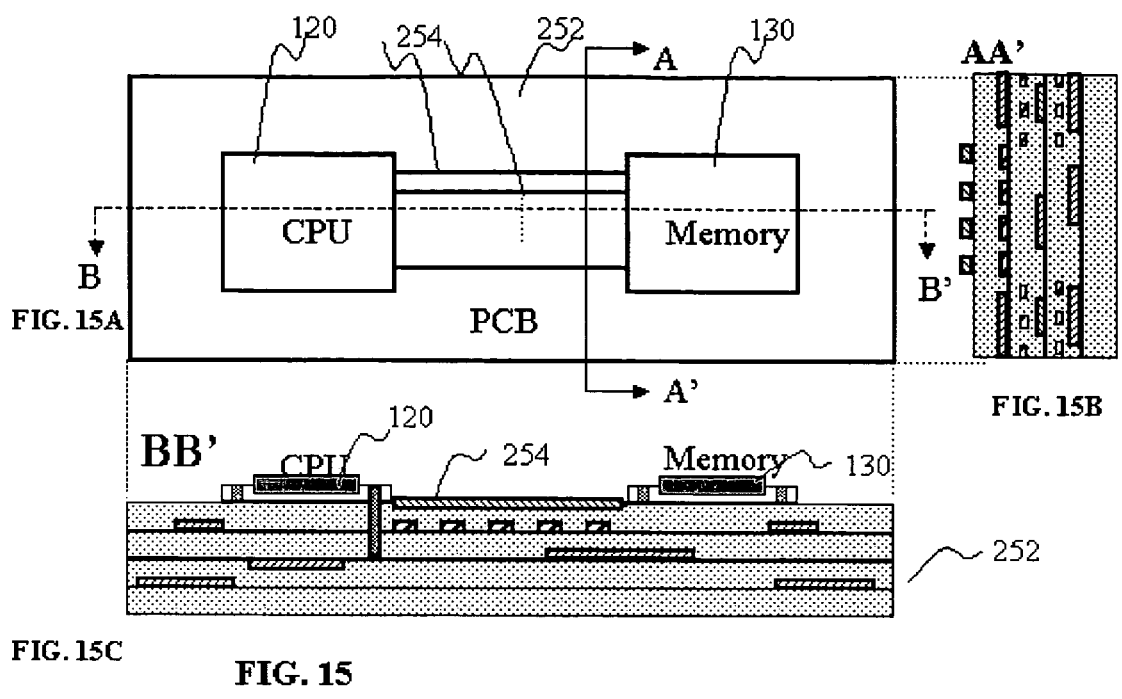
FIGS. 15A is the top view and 15B and 15C are the side and front cross-sectional views along AA' and BB' direction of FIG. 15A, illustrating the interchip (off-chip) interconnections consisting of the multilayered PCB in the eighth preferred embodiment according to the present invention.

FIGS. 15A is the top view and FIGS. 15B and 15C are cross-sectional views along AA' and BB' directions of FIG. 15A in the eighth preferred embodiment wherein the like parts are indicated by the like numerals, so that similar explanations are omitted here. In the preferred embodiment, two chips interconnection are shown. As an example, processor 120 and memory 130 interconnection are shown using the techniques explained earlier. The high speed signal line 254 can be taken from the top of the PCB layer and lower speed signal line can be take brought to the lower layer. This would reduce the possibility any discontinuities, which may arise due to the vias. Bandwidth of the interconnects using of the technique as mentioned previously, can be attained and there by on-chip's signal speed can be preserved. According to the preferred embodiment as shown in FIGS. 15, either whole portion of the PCB comprise with the embedded metal plans or the portion where the high speed chips needed to be connected, can have the metal plans embedded into the PCB layer and the rest where low speed chips are needed to be connected, are having the uniform dielectric structure in the PCB. For simplicity in drawing, enlarge portion of cross-sectional views for high speed (e.g. processor and memory) chips portion interconnects are only shown. Complete PCB portion with considering lower speed chip interconnects are not shown.

Figure 16:
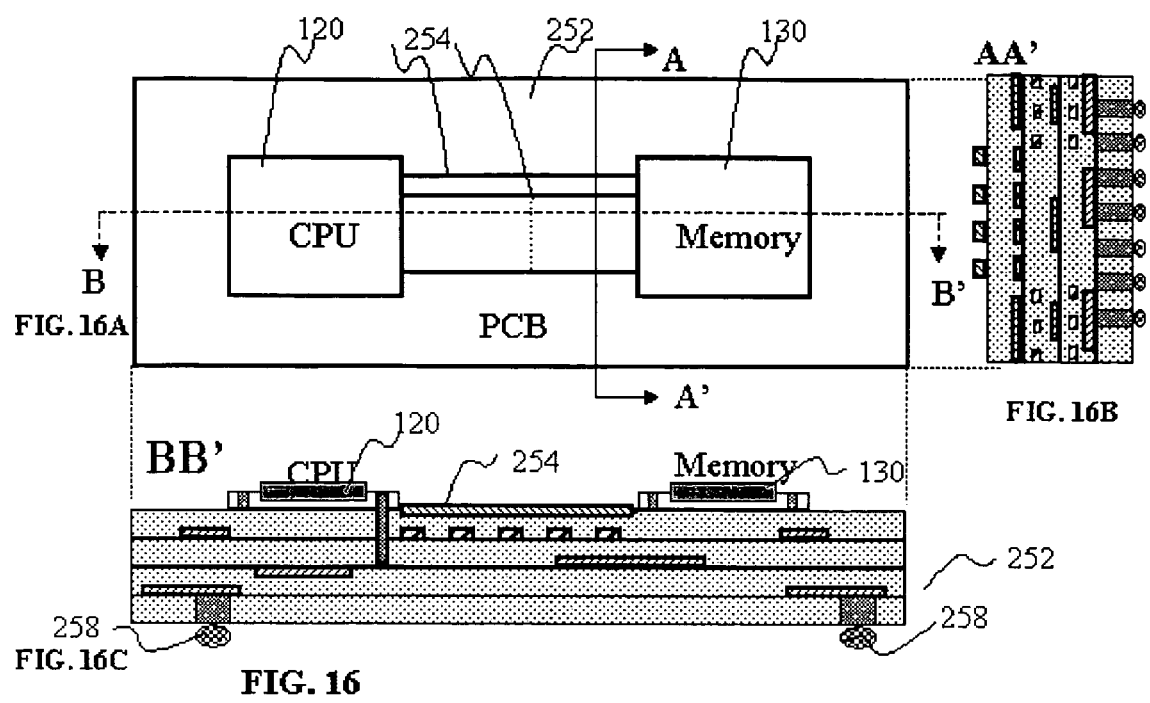
FIGS. 16A is the top-view and 16B and 16C are the side and front cross-sectional views along AA' and BB' directions of FIG. 16A, illustrating mountable/stackable the interchip (off-chip) interconnections consisting of the multilayered PCB in the ninth preferred embodiment according to the present invention.

FIG. 16A is the top view and FIGS. 16B and 16C are enlarged cross-sectional views along AA' and BB' directions of FIG. 16A in the thirteenth preferred embodiment wherein the like parts are indicated by the like numerals as used in FIGS. 2 and 16, so that similar explanations are omitted here. In the preferred embodiment, two chips interconnection are shown. In the preferred embodiments, alternatively, the high-speed chips interconnect in the separate board 256 having the metal plans embedded into it. For example for connecting the processor and memory, board with embedded metal plans structure can be used and they can be fabricated using the process as explained in FIGS. 14. Each board has the pins 258 coming out from the outside of the PCB board 256 which can be mountable on to the conventional PCB board for ground/power and low speed connections.

According to preferred embodiment, off-chip interconnects using the dielectric system can have single or multiple techniques (for reducing the microwave loss), as explained in FIGS. 8 thru 11. Embedded metal plans can be used in the dielectric system. Alternatively the low dielectric constant material or the liquid crystal polymer can also be used in multiple layers or to fill up the gaps in-between the metal plans.

The dielectric materials include all kinds of ceramic materials such as Duroid, FR4, AlN, $Al_2O_3$, Mullite ($3Al_2O_3$: $2SiO_2$), SiC, $SiO_2$, Silicone nitride, Silicon-Oxy-Nitride, BeO, Cordie-rite(magnesium alumina silicate), BN, Glass (with different compositions), epoxy glass, CaO, MnO, ZrO2, PbO, alkali-halide (e.g. NaBr, NaCl) etc.) etc., and all kinds of the polyimides and benzocyclobutenes (BCBs) having dielectric properties. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. All standard polymers can be available from the standard manufacturer for example, Du-pont, Hitachi-Chemical, Mit-sui, and Mitsubishi-Chemical Industries. Liquid crystal polymer is marketed by GoreTex, Japan.

In the preferred embodiments as explained in FIGS. 14 to 16, only microstrip line configurations are considered. However, in accordance with the present invention, other signal lines, not mentioned here, such as strip line, or coplanar line configuration with single or multiple signal lines (as single or differential) also include. Dielectric coverage (not shown) using of the same or different dielectric material can be used. Dielectric structure consisting of backside slot or multilayered of dielectric with embedded metal plans, as shown in FIGS. 8 to 11, can also be used in the PCB for high speed off-chip interconnects.

High Speed Connectors and Cables:

According to this invention, high speed connects and cable for multigigahertz signal interface/carry, can also be designed based on the techniques as explained in FIGS. 8 thru 11. Reducing the microwave loss implementing the metal plans explained previously can able to increase the bandwidth of the connector and also cables. Single or differential connectors (and also cables can be designed based on the techniques as explained previously.

Figure 11:
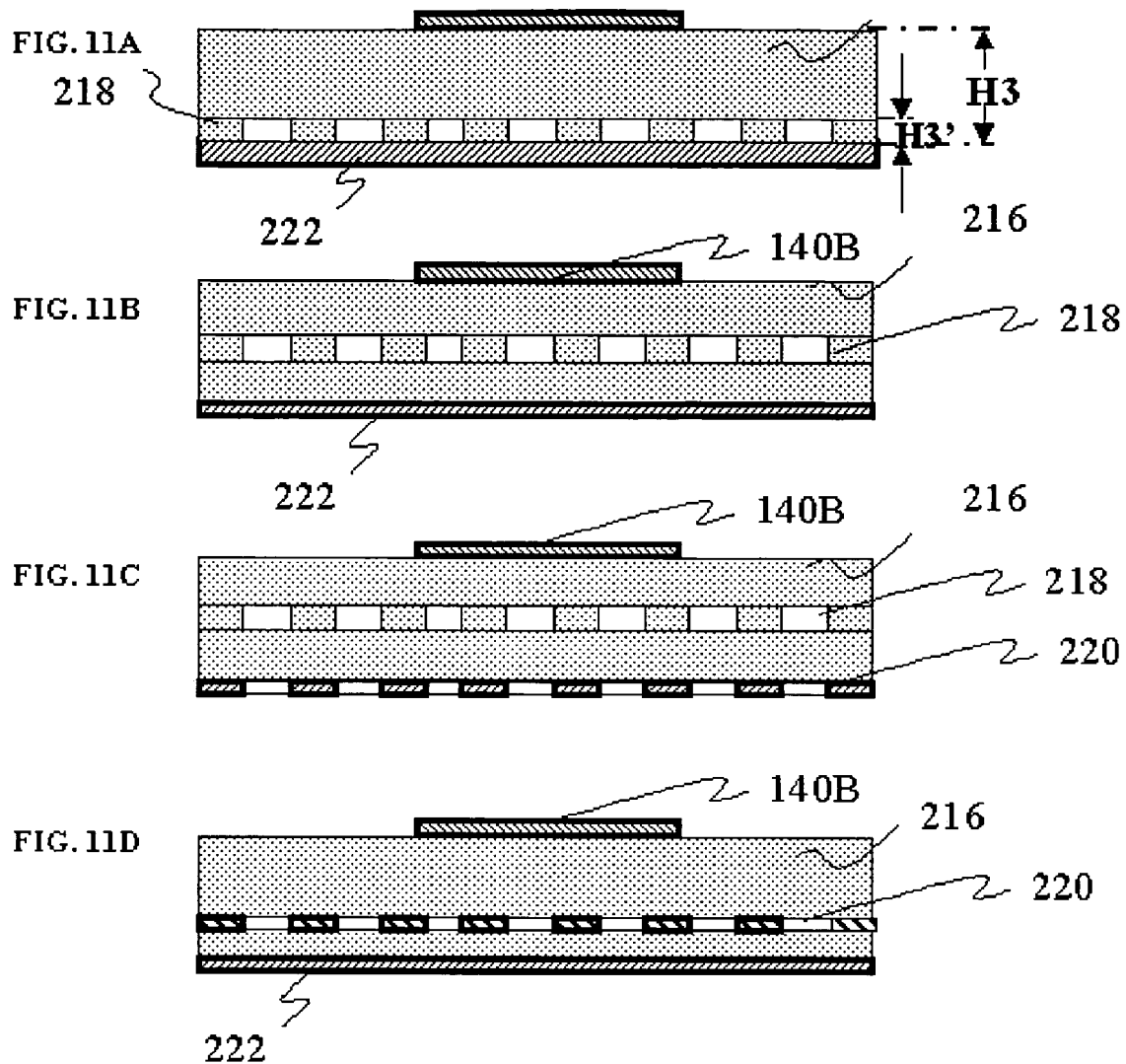
FIGS. 11A, 11B, 11C, and 11D are the cross-sectional views illustrating the microstrip configurations for electronic interconnects in a fourth preferred embodiment according to the invention.

High-Speed Chip Packaging:

According to this invention, high-speed chip packaging can also be designed based on the techniques as explained in FIGS. 8 and 11. Reducing the microwave loss implementing the conducting or metal plans into the dielectric slab explained previously can able to increase the bandwidth of the interconnects which connect chip and its package. Single or differential pairs lines can be designed using the inhomogeneous dielectric system comprising with homogeneous dielectrics and metal or conducting plans into the homogeneous dielectrics have the lower dielectric loss and dielectric constant as explained previously. High speed signal flowing through the interconnects are made to flow in-homogeneously through the dielectrics, resulting in the significant high bandwidth of the interconnects.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide the interconnects technique by which the microwave loss can be reduced and the bandwidth of the interconnects can be. It is also an object to use any dielectric material (including conventional dielectric material and the manufacturing technology) in the technique and could increase the bandwidth tremendously. In simplicity of drawing, preferred embodiments are described mostly considering the microstrip line configuration. However, all line configurations such as strip line, coplanar line with single or multiple signal line (including differential line) also cover this invention.

Several preferred embodiments for high-speed on-chip and off-chips interconnects are described considering the microstrip line configuration and also the single or multiple embedded metal plans in the dielectric s All line configurations as mentioned earlier covers also this invention. The shape of the metal array could be any type such as square, circular, or any polynomial shape etc. According to this invention, high-speed chip packaging can also be possible.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the high-speed on-chip, off-chip interconnects, where the signal speed 5 Gb/s and beyond are necessary using of the conventional material, and the bandwidth of the interconnects can be made to ideally to speed of the light for no-loss transmission line. The present invention can also be implemented in the high-speed single or multiple signal connectors, and high-speed cables (not shown). The applications include on-chip interconnects where high-speed electronics chips or electronics chips with optical chips are need to be connected. As ideally the bandwidth of the interconnect system can be made to close to fiber, future monolithic (and also hybrid near future) integration of electronics and optical chips can also interconnected without (much or none at all) sacrificing the chips speed. The application also includes the high speed multichip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The application also include the high speed (5 Gb/s and beyond) connectors and cables for high speed board-to-board, rack-to-rack interconnection, and also single or multiple high-density signal connections and carrying from one side to other in longer path.

Of course, it will be understood by those skilled in the art that the foregoing is merely illustrative of the principles of this invention, and that various modifications can be made by those skilled in the art without departing from the scope and spirit of the invention.

What is claimed is:

1. A high speed electronics interconnection system comprising:
    at least one electrical signal line with no periodic variation in thickness, said signal line for transmitting a signal between two or more electronic elements;
    a dielectric system having at least one homogeneous dielectric layer, wherein the signal line is laid on the dielectric system; and
    at least one electrical conducting plane including at least one, one dimensional array having a certain pitch, said array formed by a periodic pattern of discontinuities in a conducting material of said conducting plane,
    wherein said conducting plane serves as a ground or a power plane, and there is no electrical conducting path between the conducting plane and the at least one electrical signal line; and
    the pitch of the array determines the variation of the dielectric properties of the homogeneous dielectric layer during transmission of the signal between the two or more electronic elements through the at least one electrical signal line.

2. The interconnection system according to claim 1, wherein said dielectric system includes a second electrical conducting plane embedded into it, said second conducting plane includes at least one, one dimensional array having a certain pitch, said array formed by a periodic pattern of discontinuities in the conducting material of the second conducting plane, wherein there is no electrical conducting path between the second conducting plane and the at least one electrical signal line, and wherein the pitch of the array of the second conducting plane further determines the variation in the dielectric properties of the dielectric system.

3. The interconnection system according to claim 1 in which the dielectric interconnection system as described in claim 1 is stacked together.

4. The interconnection system according to claim 1, in which wherein tow or more electronics elements, on-chip or off-chip, is are interconnected.

5. The interconnection system according to claim 1 in which the one or more has a strip line configuration, and wherein the signal line(s) are laid into the dielectric system and an other another side is exposed to the dielectric system.

6. The interconnection system according to claim 1 in which the one or more signal lines has a strip line configuration, and wherein the signal line(s) are laid on the dielectric system, and are also exposed to the dielectric media.

7. The interconnection system according to claim 1 in which said at least one signal line has a coplanar configuration, and wherein the at least one signal line and the ground plane are in the same plane and laid on the dielectric system and are exposed to the air or inhomogeneous dielectric media.

8. The interconnection system according to claim 1 in which said dielectric system includes ceramic dielectric material.

9. The interconnection system according to claim 1 in which the dielectric system includes a polymer material having dielectric properties.

10. The interconnection system according to claim 1, fabricated using IC fabrication technology and PCB fabrication technology for on-chip and off-chip interconnects, respectively.

11. The interconnection system according to claim 1 wherein said dielectric layer(s) does not periodically vary in thickness, while allowing controlled variation in the dielectric properties of the dielectric system.

12. A high speed electronics interconnection system comprising:
    a continuous double-ended body having at least two ends, wherein one end is connected to at least one input terminal and another end is connected to at least one output terminal, said double-ended body includes;
    at least one electrical signal line with no periodic variation in thickness, said signal line for transmitting a signal between two or more electronic elements connected with the double-ended body interposed in between;
    a dielectric system having at least one homogeneous dielectric layer, wherein the signal line and the double-ended body are laid on the dielectric system; and
    at least one electric conducting plane including at least one, one dimensional array having a certain pitch, said array formed by a periodic pattern of discontinuities in a conducting material of said electric conducting plane,
    wherein said electric conducting plane serves as a ground or power plane, and there is no electrical conducting path between the conducting plane and the at least one electrical signal line, and wherein the pitch of the array determines the variation of the dielectric properties of the homogeneous dielectric layer during transmission of the signal between two or more electronic elements through the at least one electrical signal line.

13. The interconnection system according to claim 12 wherein said dielectric system includes at least one ceramic dielectric material.

14. The interconnection system according to claim 12 wherein said dielectric system includes at least one polymer material having dielectric properties.

15. The interconnection system according to claim 12, wherein the double-ended body is a cable.

* * * * *